(12) United States Patent
Ono

(10) Patent No.: US 8,100,564 B2
(45) Date of Patent: Jan. 24, 2012

(54) LIGHT EMITTING DEVICE AND ILLUMINATING DEVICE

(75) Inventor: Reiji Ono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 370 days.

(21) Appl. No.: 12/357,466

(22) Filed: Jan. 22, 2009

(65) Prior Publication Data

US 2009/0190357 A1  Jul. 30, 2009

(30) Foreign Application Priority Data

Jan. 24, 2008  (JP) .................................. 2008-013758

(51) Int. Cl.
*F21V 7/07* (2006.01)
(52) U.S. Cl. .................... 362/296.07; 362/298; 362/299; 362/309; 362/311.06; 313/110; 313/512
(58) Field of Classification Search .................. 362/317, 362/296.01, 257, 296.07, 298, 299, 296.09, 362/311.06, 308, 309; 313/110, 512
See application file for complete search history.

(56) References Cited

U.S. PATENT DOCUMENTS

| 4,271,408 | A | * | 6/1981 | Teshima et al. | 345/83 |
| 4,907,044 | A | * | 3/1990 | Schellhorn et al. | 257/98 |
| 6,296,376 | B1 | * | 10/2001 | Kondo et al. | 362/310 |
| 6,729,746 | B2 | | 5/2004 | Suehiro et al. | |
| 7,070,304 | B2 | * | 7/2006 | Imai | 362/267 |
| 7,810,956 | B2 | * | 10/2010 | Bierhuizen et al. | 362/294 |

FOREIGN PATENT DOCUMENTS

JP  2005-064145  3/2005

* cited by examiner

*Primary Examiner* — John A Ward
(74) *Attorney, Agent, or Firm* — Turocy & Watson, LLP

(57) ABSTRACT

An illuminating device in which stray lights are prevented and light distribution design is easy by making it possible to receive lights emitted from an LED lamp with an external reflecting mirror as much as possible is provided. A reflecting mirror having a concave reflecting surface reflecting an incident light, a light emitting element, and a lens molding a light emitting element therein and having a lens surface opposed to a light emitting surface of the light emitting element, the lens surface being in a slope shape with its central portion being projected to the light emitting element are included, and the reflecting surface of the reflecting mirror and the light emitting surface of the light emitting element are disposed to be opposed to each other with the lens surface of the lens therebetween so that light emitted from the light emitting element is reflected at the lens surface to be emitted outside the lens to be incident on the reflecting surface of the reflecting mirror.

19 Claims, 7 Drawing Sheets

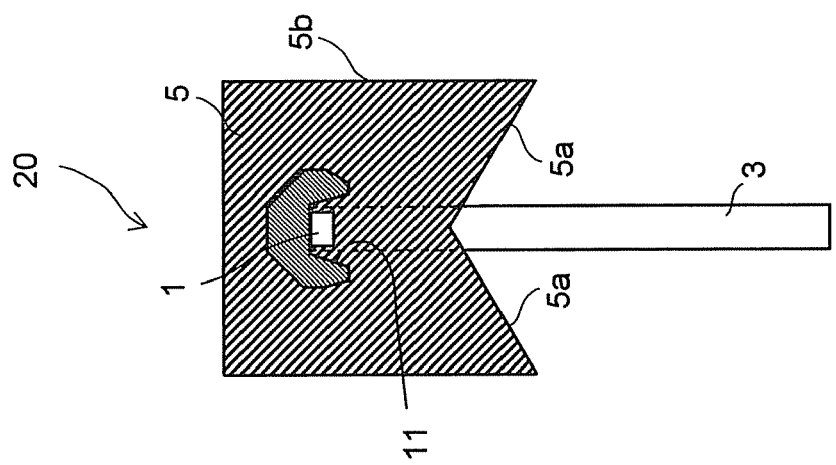
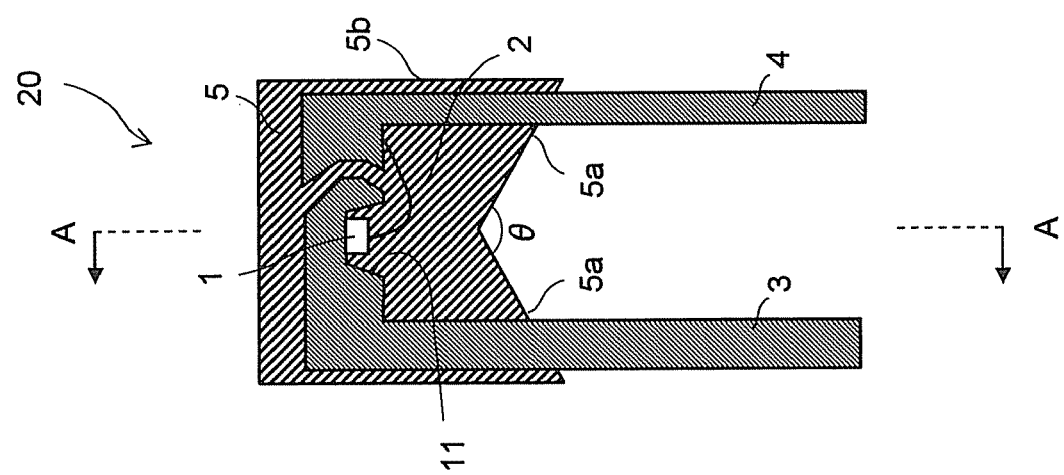
FIG. 1B
FIG. 1A

LIGHT EMITTING DEVICE AND ILLUMINATING DEVICE

CROSS REFERENCE TO RELATED APPLICATIONS

This application is based upon and claims the benefit of priority from prior Japanese Patent Application No. 2008-13758, filed on Jan. 24, 2008, the entire contents of which are incorporated herein by reference.

BACKGROUND OF THE INVENTION

1. Field of the Invention

The present invention relates to a light emitting device, a light emitting device with, for example, a light emitting diode as a light source, and an illuminating device using the same.

2. Background Art

In recent years, as light sources (light emitting devices) of external illuminating devices such as tail lamps, stop lamps and headlights mounted to automobiles and the like, instead of conventional electric bulbs having filament, LED lamps with light emitting diodes (Light Emitting Diodes) incorporated therein are frequently used. An LED lamp has the advantages of long life, low heat generation, low power consumption and space saving, and from these characteristics, the LED lamp gives the merits such as maintenance free and improvement in fuel efficiency when it is applied to an on-vehicle lamp.

Incidentally, with respect to the external illuminating devices mounted to automobiles and the like, the irradiation direction, the illuminance distribution and the like are strictly defined for the reason of the safety standards as an automobile. Even when the light source is replaced with the LED lamp, the similar characteristics are required. When a conventional electric bulb having filament is used as a light source, the light source can be regarded as a substantially point light source, and the radiation light is uniformly emitted in all directions. Therefore, it has been easy to control the light distribution characteristics of the illuminating device by using an external reflecting mirror. In contrast with this, when an LED lamp is used as the light source, it is basically difficult to design and control the light distribution characteristics in the illuminating device using an external reflecting mirror. This is because an LED lamp has less light emitted downward from the mounting surface of the light emitting element and has the property that brightness differs depending on the emission direction, due to the structure in which the light emitting element is mounted on the metal to be a lead. Further, the external illuminating device mounted to an automobile or the like has the limitation in design such as the size of the external reflecting mirror or the like, and this also becomes one cause to increase difficulty of design.

The illuminating device in which a light emitting diode is incorporated is described in, for example, Japanese Patent Laid-Open No. 2005-64145. The illuminating device enhances utilization efficiency of light by causing the light which is irradiated from a light emitting diode to a light emission range ox to be incident on a lens called a dimming body, and causing the emission light to go out from the outgoing surface of the lens.

SUMMARY OF THE INVENTION

According to one mode of the present invention, there is provided an illuminating device characterized by including a reflecting mirror having a concave reflecting surface reflecting an incident light, a light emitting element, and a lens molding the light emitting element therein and having a lens surface opposed to a light emitting surface of the light emitting element, the lens surface being in a slope shape with its central portion being projected to the light emitting element, and in that the reflecting surface of the reflecting mirror and the light emitting surface of the light emitting element are disposed to be opposed to each other with the lens surface of the lens therebetween so that a light emitted from the light emitting element is reflected at the lens surface to be emitted to an outside of the lens to be incident on the reflecting surface of the reflecting mirror.

BRIEF DESCRIPTION OF THE DRAWINGS

FIG. 1A is a sectional view of a light emitting device according to an embodiment of the present invention;

FIG. 1B is a sectional view along the A-A line in FIG. 1A;

DESCRIPTION OF THE EMBODIMENTS

Figure 2B:
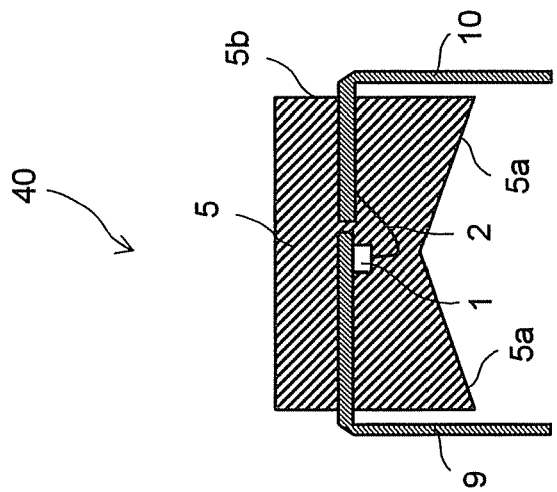
FIG. 2B is a sectional view of a process of the light emitting device according to the modified example of the embodiment of the present invention, continued from FIG. 2A.

Hereinafter, a light emitting device and an illuminating device according to an embodiment of the present invention will be described with reference to the drawings. In each of the drawings which will be described hereinafter, the components having the equivalent functions are assigned with the identical reference numerals and characters.

FIG. 1A shows a sectional view of a light emitting device (LED lamp 20) according to an embodiment of the present invention. FIG. 1B is a sectional view along the A-A line of FIG. 1A, and shows the left side portion of FIG. 1A.

The light emitting device 20 includes a light emitting element 1, a bonding wire 2, a cathode lead 3, an anode lead 4 and a V cut lens 5.

As is known from FIG. 1A, the cathode lead 3 is provided with a cup 11. The cup 11 is opened in the direction of legs of the cathode lead 3 and the anode lead 4 (the lower side in the drawings).

The light emitting element 1 is fixed to a bottom portion of the cup 11 by using an Ag paste (not illustrated) and is electrically connected to the cathode lead 3. Further, the light emitting element 1 is electrically connected to the anode lead 4 by using the bonding wire 2 (Au wire or the like).

The light emitting element 1, the bonding wire 2, and a part of each of the cathode lead 3 and the anode lead 4 are molded by a V cut lens 5.

A method for forming the V cut lens 5 will be described. First, the bonding wire 2, the cathode lead 3 mounted with the light emitting element 1, and the anode lead 4 are set in a molding die for resin molding. Thereafter, an epoxy transparent resin is poured into it, and the V cut lens 5 is molded. As the material of the V cut lens 5, a hard transparent silicon resin may be used.

As is known from FIGS. 1A and 1B, the V cut lens 5 is in a shape which can be obtained by hollowing out the surface which is opposed to the light emitting element 1 into a substantially conical shape from a cylindrical body, and has a recess in a conical shape in which a central portion of the surface is recessed. The section of the recess is in a substantially V shape constituted of slope portions 5a, as shown in FIGS. 1A and 1B.

Further, as is known from FIG. 1A, the cathode lead 3 and the anode lead 4 are formed to project outside from an inside of the V cut lens 5 through the slope portions 5a. Thereby, when an LED lamp 20 is set in an external reflecting mirror 6 (which will be described later), the slope portions 5a of the V cut lens 5 are opposed to the external reflecting mirror.

Figure 2A:
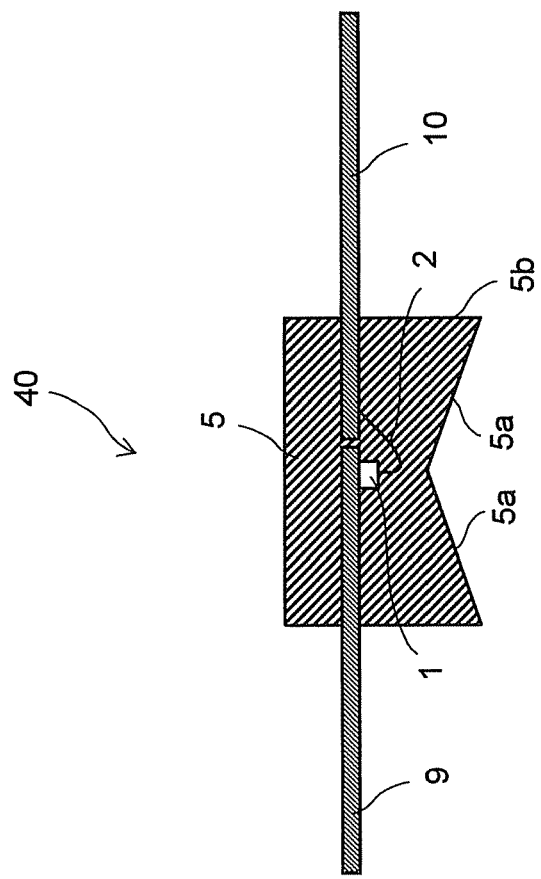
FIG. 2A is a sectional view of a process of a light emitting device according to a modified example of the embodiment of the present invention.

Next, a light emitting device according to a modified example will be described by using FIGS. 2A and 2B. FIGS. 2A and 2B show sectional views of the light emitting device (an LED lamp 40) according to the modified example.

The light emitting device 40 includes the light emitting element 1, the bonding wire 2, a cathode lead 9, an anode lead 10 and the V cut lens 5.

The light emitting element 1 is fixed to the flat cathode lead 9 without a cup with an Ag paste (not illustrated), and is electrically connected to the cathode lead 9. Further, the light emitting element 1 is electrically connected to the anode lead 10 by using the bonding wire 2 (Au wire or the like). By using the aforementioned cathode lead 3 instead of the cathode lead 9, the light emitting device 1 may be mounted on the cup 11 of the cathode lead 3 as the aforementioned LED lamp 20.

The light emitting element 1, the bonding wire 2 and a part of each of the cathode lead 9 and the anode lead 10 are molded by the V cut lens 5. The V cut lens 5 is formed by the similar method to the aforementioned embodiment.

As shown in FIG. 2B, the anode lead 9 and the cathode lead 10 are bent in the direction (lower side in the drawing) of the slope portions 5a of the V cut lens 5.

One of the points in which the LED lamp 40 differs from the aforementioned LED lamp 20 is which surface of the V cut lens 5 the anode lead 9 and the cathode lead 10 are projected from. More specifically, as is known from FIGS. 2A and 2B, the anode lead 9 and the cathode lead 10 are formed to project outside through side surface portions 5b instead of the slope portions 5a. The anode lead 9 and the cathode lead 10 are bent in the direction (lower side in the drawings) of the slope portions 5a. By adopting such a constitution, the LED lamp 40 is suitable for being surface-mounted on a printed board.

Next, the emission characteristics of the lights of the abovementioned LED lamps 20 and 40 will be described.

As is known from FIGS. 1A and 2A, the slope portions 5a of the V cut lens 5 are provided face to face with the light emitting element 1. Therefore, some of the lights emitted from the light emitting element 1 pass through the inside of the V cut lens 5, and is totally reflected to an outside at the slope portions 5a, and is emitted in a substantially horizontal direction from the side surface portions 5b of the LED lamps 20 and 40.

Figure 6:
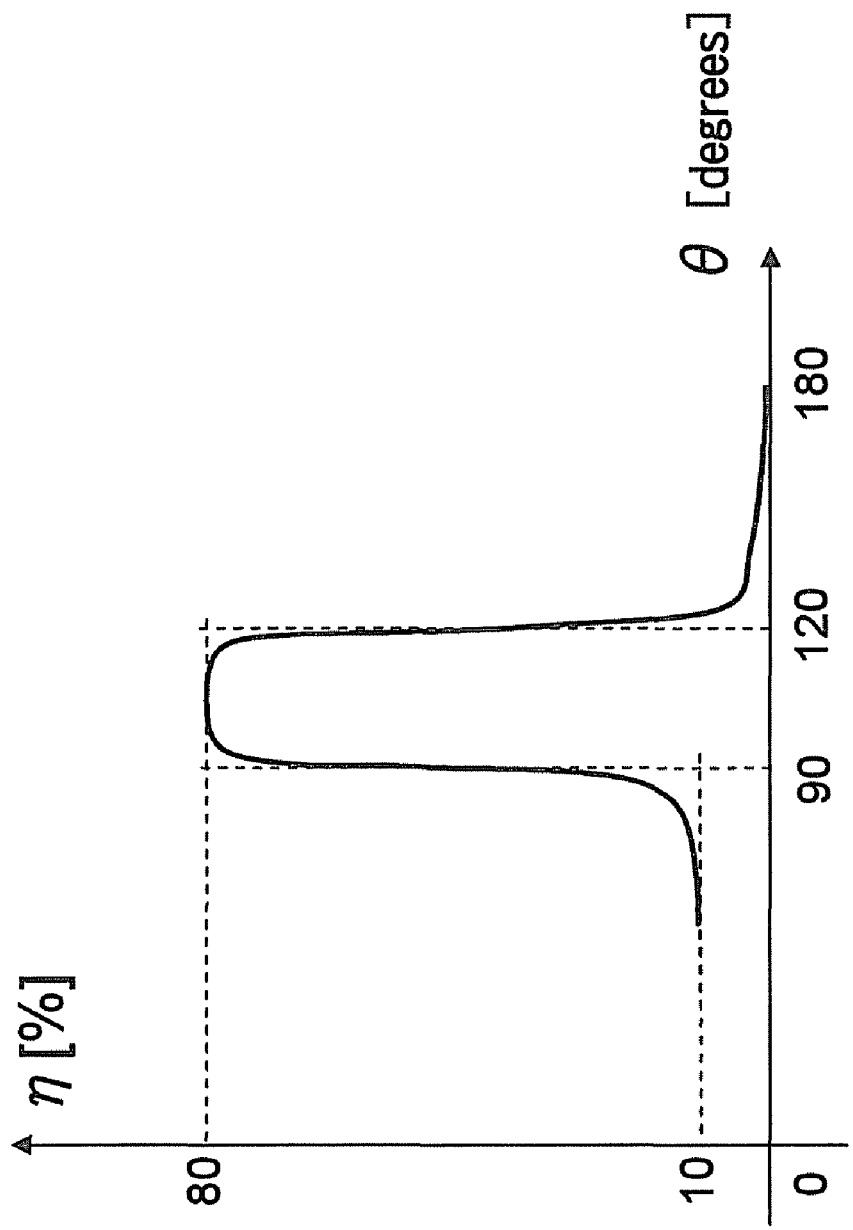
FIG. 6 is a diagram showing the relationship of a V cut lens opening angle $\theta$ and light extraction efficiency $\eta$.

FIG. 6 shows the relationship of an opening angle θ of the slopes of the V cut lens 5 and a ratio η of the light extracted from the side surface portions 5b among the emission lights from the light emitting element 1.

As is known from FIG. 6, the ratio η abruptly becomes large in the range of the opening angle θ of 90° to 120°. As the ratio η becomes larger, the ratio of the light capable of being received by an external reflecting mirror (which will be described later) increases, and therefore, control of the light distribution characteristics by the external reflecting mirror becomes easy.

Accordingly, the opening angle of the V cut lens 5 is desired to be 90° to 120°, and preferably 110 degrees.

Next, an illuminating device 30 with the abovementioned LED lamp 20 being incorporated will be described.

Figure 3:
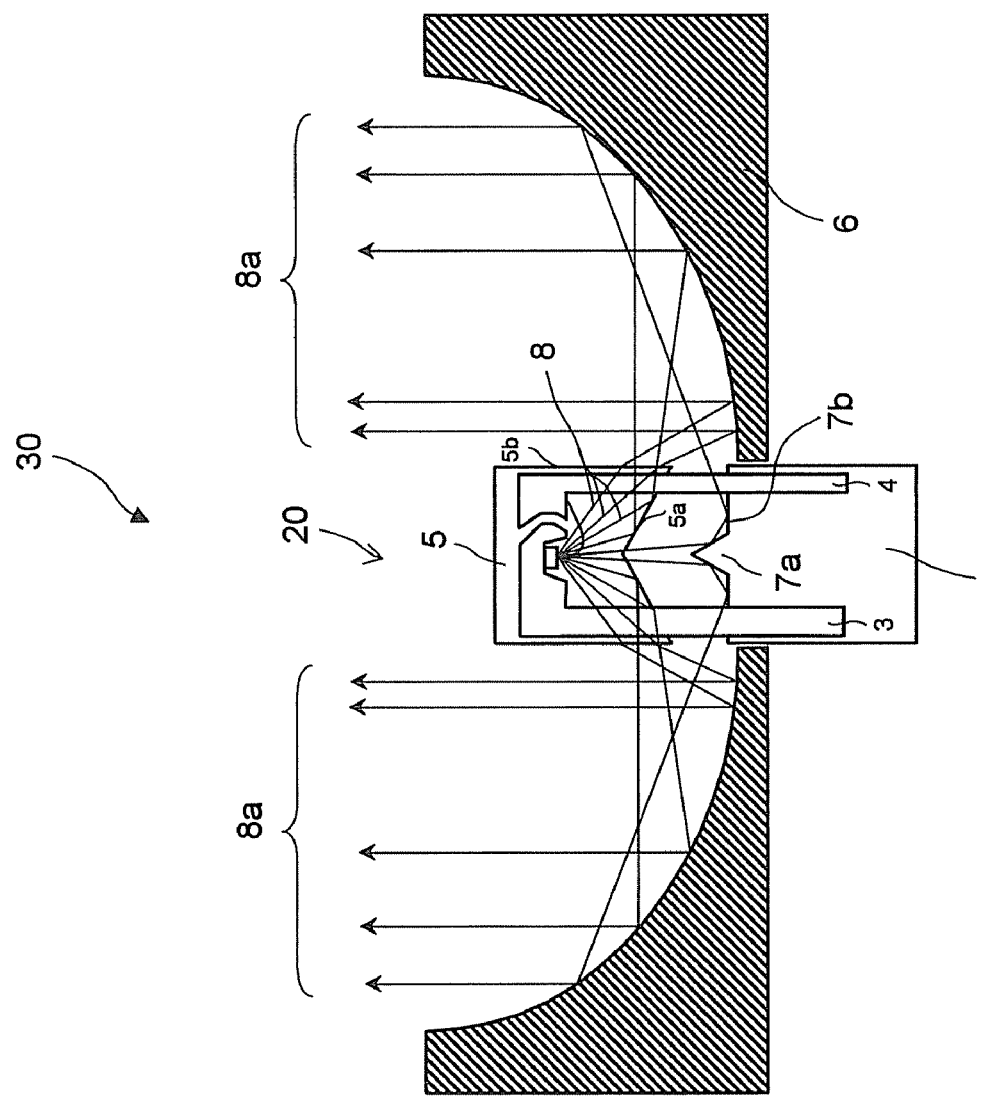
FIG. 3 is a sectional view of an illuminating device according to an embodiment of the present invention.

FIG. 3 shows a section of the illuminating device 30 according to an embodiment of the present invention. The illuminating device 30 includes an external reflecting mirror 6 having a concave surface, the LED lamp 20 and a socket 7. The socket 7 in which the LED lamp 20 is inserted is installed in a central portion of the external reflecting mirror 6. The cathode lead 3 and the anode lead 4 of the LED lamp 20 are inserted into the socket 7. Instead of the LED lamp 20, the LED lamp 40 may be incorporated into the external reflecting mirror 6.

As is known from FIG. 3, the external reflecting mirror 6 reflects an emission light 8 from the light emitting element 1 forward from the illuminating device 30 (upward in the drawing). The external reflecting mirror 6 can take various shapes in accordance with the conditions of the irradiation direction, the illuminance distribution and the like required of the illuminating device.

The socket 7 has a socket projected portion 7a in a part of its surface portion 7b. The socket projected portion 7a and the surface portion 7b are coated with a reflective film for reflecting a part of the emission light 8 toward the external reflecting mirror 6. The socket projected portion 7a is a substantially conical body formed on the socket surface portion 7b directly below the light emitting element 1. A part of the emission light 8 which is emitted from the light emitting element 1 in a direction to substantially directly below the light emitting element 1 in the drawing and is not reflected at the slope portions 5a of the V cut lens 5 is reflected at the socket projected portion 7a to the external reflecting mirror 6. Thereby, the above described emission light 8 can be prevented from returning to the LED lamp 20, and stray light can be decreased. The shape of the socket projected portion 7a may be other than the conical shape, and for example, may be a semispherical shape.

As is known from FIG. 3, the illuminating device 30 has the structure which causes the LED lamp 20 to emit the emission light 8 in a substantially horizontal direction from the side surface portions 5b of the V cut lens 5, and reflects the emission light 8 by using the external reflecting mirror 6 to change the optical path to the forward direction (upward in the drawing) from the illuminating device 30, and extracts the light as a reflection light 8a. One large illuminating device may be constituted by arranging a plurality of illuminating devices 30 on a plane.

One of the characteristics in the illuminating device 30 is that the slope portions 5a of the V cut lens 5 are opposed to the reflection surface of the external reflecting mirror 6. Specifically, the light emitting element 1 is provided to emit light toward the external reflecting mirror 6, and the slope portions 5a for totally reflecting the emission light 8 from the light emitting element 1 are provided between the light emitting element 1 and the external reflecting mirror.

By such a structure, the emission light 8 from the light emitting element 1 is emitted in the substantially horizontal direction from the side surface portion 5b of the V cut lens 5 as much as possible. The emission light 8 is incident on the external reflecting mirror 6 and is reflected in the emission direction by the external reflecting mirror 6. Thereby, as compared with a comparative example which will be described later, more emission light 8 can be received by the external reflecting mirror 6. Therefore, the light distribution characteristics of the illuminating device 30 can be controlled with the external reflecting mirror 6, and design of the light distribution characteristics is made easy.

Therefore, according to the present embodiment, the problem peculiar to the illuminating device using the LED lamp, that is, difficulty in design of the light distribution characteristics can be solved.

The illuminating device according to the embodiment of the present invention is suitable for the illuminating devices from which the emission directions and emission distributions are strictly required, such as, for example, external illuminating devices mounted to automobiles and the like, and spotlights.

Next, a comparative example known by the present inventor, with respect to the aforementioned illuminating device 30 will be described.

Figure 4A:
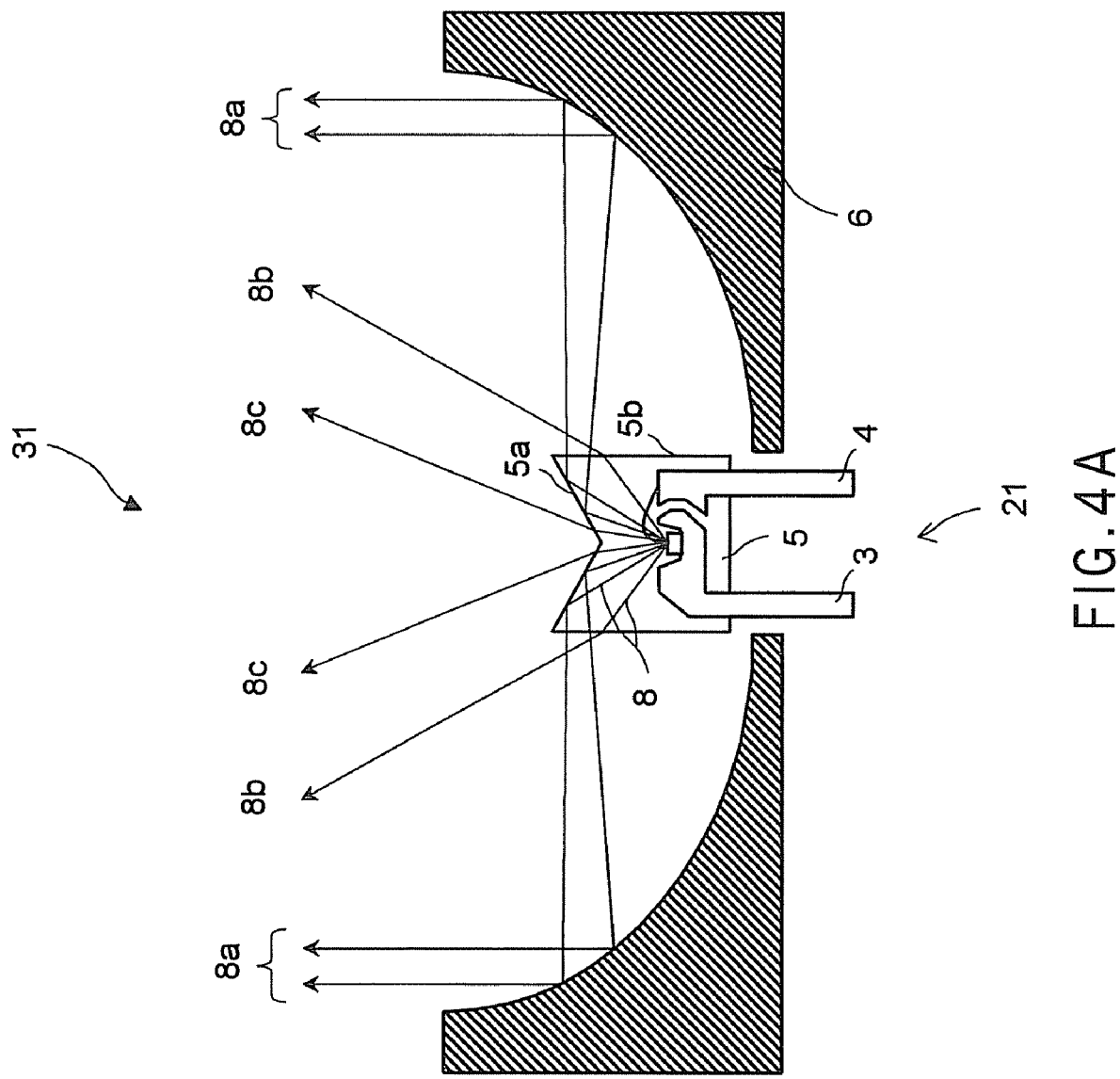
FIG. 4A is a sectional view of an illuminating device according to a comparative example.

FIG. 4A shows a sectional view of an illuminating device 31 according to a comparative example. As is known from FIG. 4A, an LED lamp 21 is fixed to a central portion of the external reflecting mirror 6. Similarly to the aforementioned LED 20, the LED lamp 21 includes the light emitting element 1, the bonding wire 2, the cathode lead 3, the anode lead 4 and the V cut lens 5. However, the LED lamp 21 differs from the aforementioned LED lamp 20 in the following points. First, the cup 11 of the cathode lead 3 on which the light emitting element 1 is mounted is opened in the opposite direction from the leg of the cathode lead 3 (the illumination direction of the illuminating device 31). Next, the cathode lead 3 and the anode lead 4 are formed to be projected outside from an inside through a surface opposed to the slope portions 5a of the V cut lens 5.

One of the points in which the illuminating device 31 differs from the above described embodiment (illuminating device 30) is that the light emitting element 1 is provided to emit light in the illumination direction (upward in the drawing) of the illuminating device 31, and the slope portions 5a of the V cut lens 5 for totally reflecting the emission light 8 are provided in the illumination direction (upward in the drawing) of the light emitting element 1, as is known from FIG. 4A.

In the illuminating device 31 of such a constitution, the emission light 8 of the light emitting element 1 travels as follows. Specifically, as is also known from FIG. 4A, among the emission lights 8 of the light emitting element 1, the reflection light 8a which is totally reflected at the slope portions 5a travels in a substantially horizontal direction of the LED lamp 21, and is reflected at the external reflecting mirror 6 to be emitted forward (upward in the drawing) from the illuminating device 31 (reflection light 8a). The light which is incident on the upper portion in the drawing in the side surface portion 5b of the V cut lens 5 is refracted at the side surface portion 5b, and thereafter, is directly irradiated to an outside without being reflected at the external reflecting mirror 6 to be a stray light (stray light 8b). Further, when even the light which is incident on the slope portion 5a of the V cut lens 5 is in the vicinity of the center, the light is not reflected at the slope portion 5a, and becomes a stray light (stray light 8c).

Such stray lights 8b and 8c are the components of the emission light 8 of which light distribution characteristics cannot be controlled by the external reflecting mirror 6, and therefore, they are desired to be reduced as much as possible.

Figure 4B:
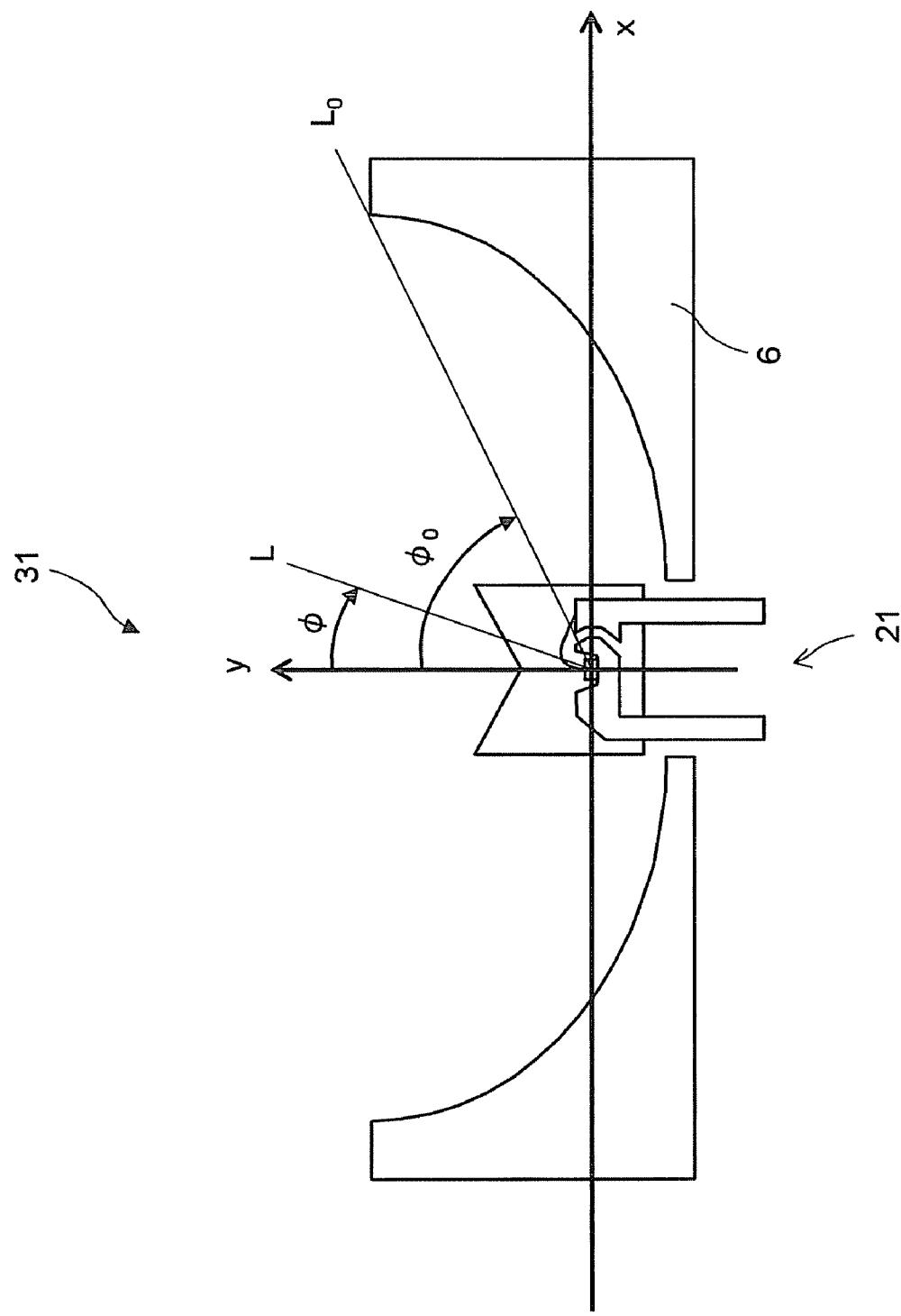
FIG. 4B is a view showing the definition of an emission angle $\phi$.
Figure 5:
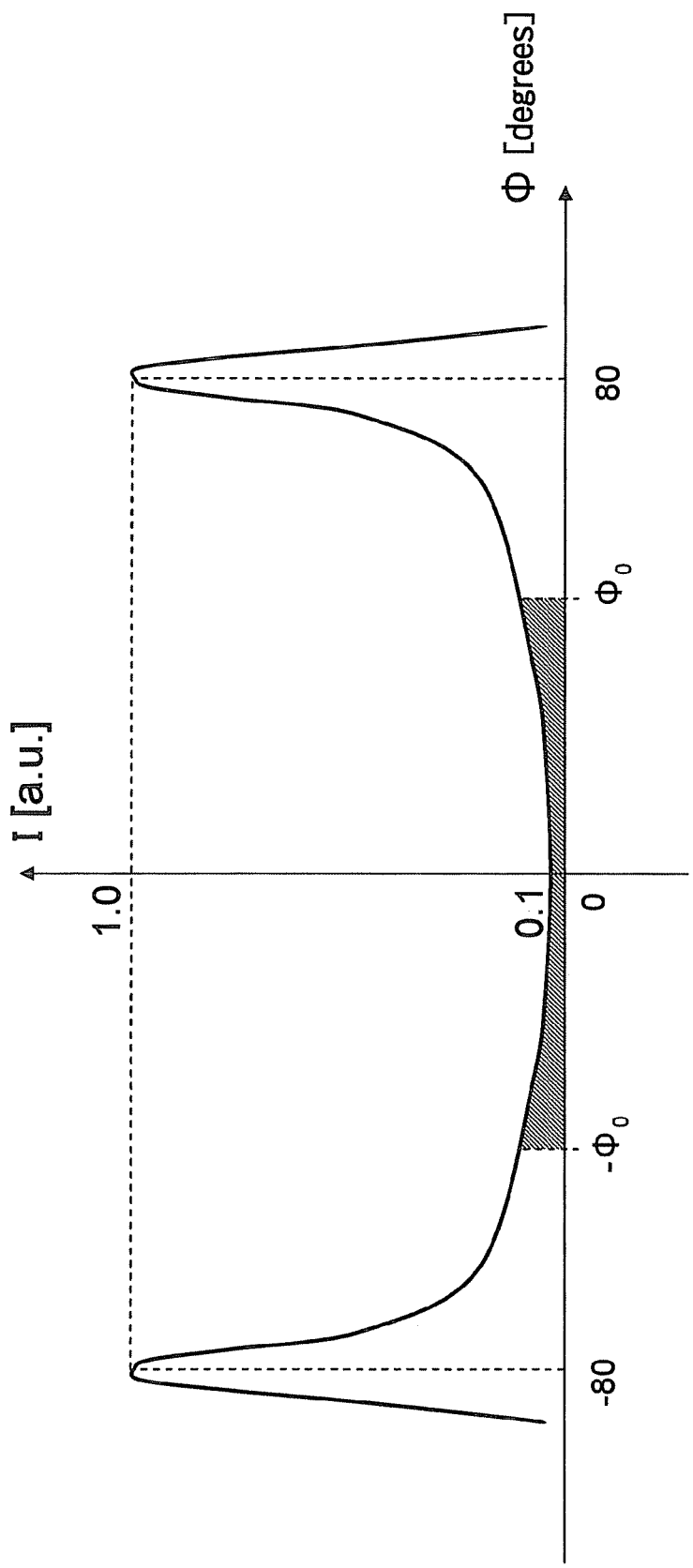
FIG. 5 is a diagram showing the relationship of the emission angle $\phi$ and a light intensity "I" of the light emitting device.

FIG. 5 shows the relationship of an emission angle $\phi$ of the emission light 8 of the LED lamp 21 and the light intensity. Here, the opening angle $\theta$ of the slopes of the V cut lens 5 is set at 110°. The emission angle $\phi$ is defined as the angle formed by a "y" axis and a straight line "L" as shown in FIG. 4B. An "x" axis, the "y" axis and the straight line "L" all pass through the light emitting element 1. For example, the emission light at $\phi=\pm90°$ means the light emitted in the horizontal direction of the LED lamp 21.

As shown in FIG. 5, a light intensity "I" reaches its peak at $\phi=\pm80$ degrees, and much light is emitted in the substantially horizontal direction of the LED lamp 21. The light components of the aforementioned stray lights 8b and 8c are expressed as the diagonally shaded area $(-\phi_0 \leq \phi \leq \phi_0)$ of FIG. 5. Here, the emission angle $\phi_0$ is the angle formed by the "y" axis and the straight line $L_0$ as is known from FIG. 4B. The straight line $L_0$ is the straight line passing through the light emitting element 1 and the edge portion of the external reflecting mirror 6.

The illuminating device 30 according to the aforementioned embodiment of the present invention can receive and reflect the emission lights in the range of $-\phi_0 \leq \phi \leq \phi_0$ with the external reflecting mirror 6 (and the socket 7) by providing the V cut lens 5 to be opposed to the reflecting surface of the external reflecting mirror 6 as is known from FIG. 3. This means that the emission light 8 can be controlled with the external reflecting mirror 6.

From the above, according to the embodiment of the present invention, the emission light 8 from the light emitting element 1 can be received with the external reflecting mirror 6 as much as possible, whereby stray lights are prevented, and design of the light distribution of the illuminating device can be made easy.

Additional advantages and modifications will readily occur to those skilled in the art.

Therefore, the invention in its broader aspects is not limited to the specific details and representative embodiments shown and described herein.

Accordingly, various modifications may be made without departing from the spirit or scope of the general inventive concepts as defined by the appended claims and their equivalents.

The invention claimed is:

1. An illuminating device, comprising:
   a reflecting mirror having a concave reflecting surface reflecting an incident light;
   a light emitting element; and
   a lens molding said light emitting element therein and having a lens surface opposed to a light emitting surface of said light emitting element, said lens surface being in a slope shape with its central portion being projected to said light emitting element,
   wherein said lens is disposed on said reflecting mirror so that said light emitting elements emit light toward said concave reflecting surface of said reflecting mirror.

2. The illuminating device according to claim 1, further comprising:
   a socket mounted on said reflecting mirror and supporting said lens, the socket having an auxiliary reflecting surface opposed to said lens surface,
   wherein, at a projected portion of said socket formed to project toward said lens from said socket, said auxiliary reflecting surface is formed so as to guide a light in the vicinity of an optical axis of said light emitting element among lights emitted from said light emitting element to said reflecting surface.

3. The illuminating device according to claim 2, further comprising:
   a plurality of leads serving as electrodes of said light emitting element, each lead having an inner portion and an outer portion, wherein said inner portion is molded by said lens, and wherein said outer portion is projected from said lens and extends along a direction to the lens surface of said lens from the light emitting surface of said light emitting element in said lens, said outer portion being attached to said socket, wherein said light emitting element is mounted to said inner portion of one of said leads.

4. The illuminating device according to claim 3, wherein said outer portion of said each lead is projected from said lens surface of said lens.

5. The illuminating device according to claim 3, wherein said outer portion of said each lead is projected from a side surface of said lens.

6. The illuminating device according to claim 3, wherein said auxiliary reflecting surface included by said socket is in a conical or semispherical shape.

7. The illuminating device according to claim 3, wherein an angle formed by slopes of said lens surface of said lens is 90° to 120°.

8. The illuminating device according to claim 2, wherein said auxiliary reflecting surface included by said socket is in a conical or semispherical shape.

9. The illuminating device according to claim 8, further comprising:

a plurality of leads serving as electrodes of said light emitting element, each lead having an inner portion and an outer portion, wherein said inner portion is molded by said lens, and wherein said outer portion is projected from said lens and extends along a direction to the lens surface of said lens from the light emitting surface of said light emitting element in said lens, said outer portion being attached to said socket, wherein said light emitting element is mounted to said inner portion of one of said leads.

10. The illuminating device according to claim 9, wherein said outer portion of said each lead is projected from said lens surface of said lens.

11. The illuminating device according to claim 9, wherein said outer portion of said each lead is projected from a side surface of said lens.

12. The illuminating device according to claim 9, wherein an angle formed by slopes of said lens surface of said lens is 90° to 120°.

13. The illuminating device according to claim 2, wherein an angle formed by slopes of said lens surface of said lens is 90° to 120°.

14. The illuminating device according to claim 13, wherein said auxiliary reflecting surface included by said socket is in a conical or semispherical shape.

15. The illuminating device according to claim 1, wherein an angle formed by slopes of said lens surface of said lens is 90° to 120°.

16. A light emitting device, comprising:
a light emitting element;
a lens molding said light emitting element therein and having a lens surface opposed to a light emitting surface of said light emitting element, said lens surface being in a slope shape with its central portion being projected to said light emitting element;
a plurality of leads serving as electrodes of said light emitting element, each lead having an inner portion and an outer portion, wherein said inner portion is molded by said lens, and wherein said outer portion is projected from said lens and extends along a direction to the lens surface of said lens from the light emitting surface of said light emitting element in said lens,
wherein said light emitting element is mounted to said inner portion of one of said leads, and a light emitted from said light emitting element is reflected at said lens surface to be emitted to an outside of said lens; and
wherein said outer portion of said each lead is projected from said lens surface of said lens.

17. The light emitting device according to claim 16, wherein an angle formed by slopes of said lens surface of said lens is 90° to 120°.

18. A light emitting device, comprising:
a light emitting element;
a lens molding said light emitting element therein and having a lens surface opposed to a light emitting surface of said light emitting element, said lens surface being in a slope shape with its central portion being projected to said light emitting element;
a plurality of leads serving as electrodes of said light emitting element, each lead having an inner portion and an outer portion, wherein said inner portion is molded by said lens, and wherein said outer portion is projected from said lens and extends along a direction to the lens surface of said lens from the light emitting surface of said light emitting element in said lens,
wherein said light emitting element is mounted to said inner portion of one of said leads, and a light emitted from said light emitting element is reflected at said lens surface to be emitted to an outside of said lens; and
wherein said outer portion of said each lead is projected from a side surface of said lens and bent in the direction of said lens surface.

19. The light emitting device according to claim 18, wherein an angle formed by slopes of said lens surface of said lens is 90° to 120°.

* * * * *